United States Patent
Badat et al.

(10) Patent No.: US 12,133,365 B2
(45) Date of Patent: Oct. 29, 2024

(54) COOLING SYSTEM AND METHODS

(71) Applicant: EvansWerks, Inc., Milwaukee, WI (US)

(72) Inventors: Shuaib Badat, Century City (ZA); Justin Eugene Evans, Milwaukee, WI (US); Cody Hubman, Bozeman, MT (US)

( * ) Notice: Subject to any disclaimer, the term of this patent is extended or adjusted under 35 U.S.C. 154(b) by 0 days.

(21) Appl. No.: 17/808,995

(22) Filed: Jun. 25, 2022

(65) Prior Publication Data
US 2023/0422447 A1    Dec. 28, 2023

(51) Int. Cl.
*H05K 7/20* (2006.01)
*B23P 15/26* (2006.01)
*H01L 21/48* (2006.01)

(52) U.S. Cl.
CPC .......... *H05K 7/20418* (2013.01); *B23P 15/26* (2013.01); *H01L 21/4871* (2013.01); *H01L 21/4878* (2013.01); *H01L 21/4882* (2013.01); *H05K 7/20327* (2013.01); *H05K 7/20336* (2013.01)

(58) Field of Classification Search
CPC ........... H05K 7/20418; H05K 7/20327; H05K 7/20336; B23P 15/26; B23P 11/025; H01L 21/4871; H01L 21/4878; H01L 21/4882; F28D 1/035; F28D 1/047; F28D 15/025; F28D 15/0283; F28D 2021/0029; F28F 3/12
See application file for complete search history.

(56) References Cited

U.S. PATENT DOCUMENTS

| 4,118,756 A | 10/1978 | Nelson |
| 4,186,422 A | 1/1980 | Laermer |
| 4,188,977 A | 2/1980 | Laakaniemi |
| 4,536,824 A | 8/1985 | Barrett |
| 4,706,164 A | 11/1987 | L'Henaff |
| 5,142,441 A | 8/1992 | Seibold |
| 5,818,692 A | 10/1998 | Denney |

(Continued)

OTHER PUBLICATIONS

USPTO Office Action in U.S. Appl. No. 17/808,994 dated Jan. 18, 2024.

(Continued)

*Primary Examiner* — Lee A Holly
(74) *Attorney, Agent, or Firm* — Johnfar Kerlee

(57) ABSTRACT

Disclosed are systems and methods for cooling electronic devices. In one embodiment, a method of manufacturing a cooling system includes providing a core having open, fluid channels on a first core side; providing a cover configured to cover the channels, and the cover further configured to couple to the core to form a leak proof seal. In some embodiments, a leak proof seal can be obtained through an interference fit. In certain embodiments, a leak proof seal can be obtained through a thermal fitting. In one embodiment, the core is shrank through cooling and then placed inside the cover. In some embodiments, the cover is expanded through heating and the core is placed inside the cover. In certain embodiments, the core is a metal core printed circuit board. In one embodiment, an electro-osmotic pump, a gas accumulator, and a heat exchanger can be operationally coupled to the channels.

19 Claims, 14 Drawing Sheets

(56) References Cited

U.S. PATENT DOCUMENTS

| | | |
|---|---|---|
| 5,929,518 A | 7/1999 | Schlaiss |
| 5,986,884 A | 11/1999 | Jairazbhoy |
| 6,132,823 A | 10/2000 | Qu |
| 6,212,071 B1 | 4/2001 | Roessler |
| 6,292,366 B1 | 9/2001 | Platt |
| 6,365,260 B1 | 4/2002 | Stecher |
| 6,377,457 B1 | 4/2002 | Seshan |
| 6,473,963 B1 | 11/2002 | Goenka |
| 6,480,385 B2 | 11/2002 | Seshan |
| 6,490,159 B1 | 12/2002 | Goenka |
| 6,496,370 B2 | 12/2002 | Geusic |
| 6,665,185 B1 | 12/2003 | Kulik |
| 6,901,217 B2 | 5/2005 | Gamboa |
| 7,000,684 B2 | 2/2006 | Kenny |
| 7,021,369 B2 | 4/2006 | Werner et al. |
| 7,063,268 B2 | 6/2006 | Chrysler |
| 7,086,839 B2 | 8/2006 | Kenny |
| 7,092,255 B2 | 8/2006 | Barson |
| 7,110,258 B2 | 9/2006 | Ding |
| 7,176,382 B1 | 2/2007 | Shi |
| 7,215,547 B2 | 5/2007 | Chang |
| 7,267,755 B2 | 9/2007 | Lin |
| 7,298,623 B1 | 11/2007 | Kuczynski |
| 7,397,665 B2 | 7/2008 | Yuval |
| 7,460,367 B2 | 12/2008 | Tracewell |
| 7,538,425 B2 | 5/2009 | Myers |
| 7,558,071 B2 | 7/2009 | Sugahara |
| 7,601,270 B1 | 10/2009 | Unger et al. |
| 7,738,249 B2 | 6/2010 | Chan |
| 7,898,807 B2 | 3/2011 | Beaupre |
| 7,948,758 B2 | 5/2011 | Buhler |
| 7,960,655 B2 | 6/2011 | Han |
| 8,017,872 B2 | 9/2011 | Cripe |
| 8,044,301 B2 | 10/2011 | Son |
| 8,174,830 B2 | 5/2012 | Lower |
| 8,223,494 B2 | 7/2012 | Bult |
| 8,420,954 B2 | 4/2013 | Lin |
| 8,482,920 B2 | 7/2013 | Tissot |
| 9,125,305 B2 | 9/2015 | Emery |
| 9,362,202 B2 | 6/2016 | Baba |
| 9,398,682 B2 | 7/2016 | Patil |
| 9,441,753 B2 | 9/2016 | Strauss |
| 9,510,479 B2 | 11/2016 | Vos |
| 9,642,244 B2 | 5/2017 | Fontana |
| 9,686,887 B2 | 6/2017 | D'Onofrio |
| 9,713,285 B2 | 7/2017 | Cader |
| 9,807,906 B2 * | 10/2017 | Zhang ................... H01L 23/473 |
| 9,894,748 B2 | 2/2018 | Tsunoda |
| 9,894,802 B2 | 2/2018 | Loewen |
| 9,960,101 B2 | 5/2018 | Milne |
| 9,999,156 B2 | 6/2018 | Holahan |
| 10,091,909 B2 | 10/2018 | Brunshwiler |
| 10,091,911 B2 | 10/2018 | Kelty |
| 10,104,805 B2 | 10/2018 | Lazarus |
| 10,237,967 B2 | 3/2019 | Maillet |
| 10,327,325 B2 | 6/2019 | Edlinger |
| 10,330,397 B2 | 6/2019 | Chen |
| 10,356,891 B2 | 7/2019 | Kim |
| 10,361,143 B2 | 7/2019 | Adams |
| 10,431,475 B2 | 10/2019 | Bandorawalla |
| 10,512,152 B2 | 12/2019 | Smith |
| 10,548,215 B2 | 1/2020 | Yang |
| 10,660,199 B1 | 5/2020 | Flowers |
| 10,665,526 B2 | 5/2020 | De Sousa |
| 10,699,986 B2 | 6/2020 | Kearney |
| 10,746,475 B2 * | 8/2020 | Roberts ................ F28D 15/025 |
| 10,788,034 B2 | 9/2020 | Ganti |
| 10,791,649 B2 | 9/2020 | Dede |
| 10,945,333 B1 | 3/2021 | Joshi |
| 11,057,983 B2 | 7/2021 | Koppl |
| 11,062,824 B2 | 7/2021 | Flowers |
| 11,089,688 B2 | 8/2021 | Larson |
| 11,105,257 B2 | 8/2021 | Louco |
| 11,240,910 B2 | 2/2022 | Liu |
| 11,266,012 B2 | 3/2022 | Reiter |
| 11,277,937 B2 | 3/2022 | Malouin |
| 11,284,533 B2 | 3/2022 | Kawata |
| 2003/0062149 A1 * | 4/2003 | Goodson ............... H01L 23/473 |
| | | 257/E23.098 |
| 2007/0001765 A1 | 1/2007 | Brunschwiler |
| 2009/0044928 A1 | 2/2009 | Upadhya et al. |
| 2010/0183481 A1 | 7/2010 | Facer et al. |
| 2010/0311060 A1 | 12/2010 | Facer et al. |
| 2013/0015342 A1 | 6/2013 | Puleo |
| 2022/0243996 A1 * | 8/2022 | Gaigg ................... F28D 15/046 |
| 2022/0373266 A1 * | 11/2022 | Zhu ....................... F28D 15/04 |

OTHER PUBLICATIONS

USPTO Notice of Allowance in U.S. Appl. No. 17/808,994 dated May 15, 2024.

USPTO Office Action in U.S. Appl. No. 17/808,990 dated Apr. 18, 2024.

USPTO, Notice of Allowance in U.S. Appl. No. 17/808,994, Jun. 28, 2024.

* cited by examiner

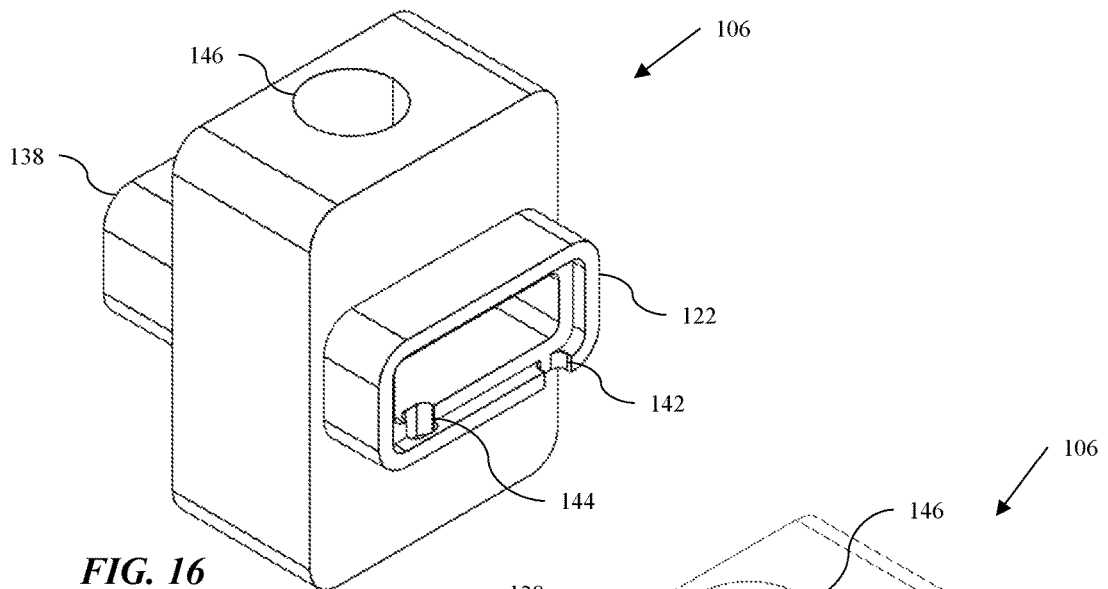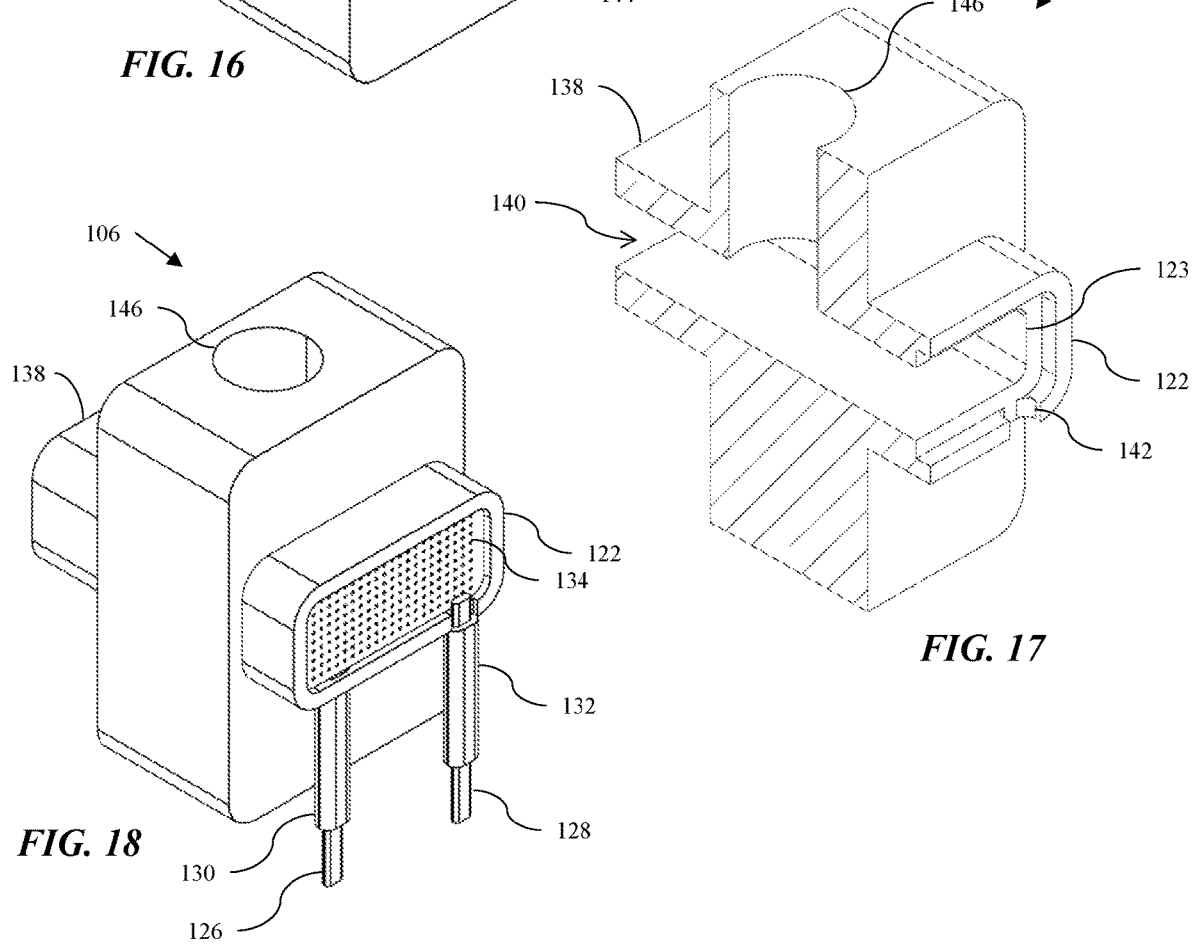

COOLING SYSTEM AND METHODS

FIELD

Embodiments of the invention generally relate to systems and methods for cooling electronic devices. In particular, one embodiment of the invention is directed to a method of manufacturing a cooling system. The method can involve providing a core with channels on a side of the core, and coupling a cover to the core; the cover configured to cover the channels and to provide a leak proof seal with the core. In some embodiments, a leak proof seal can be obtained, for example, using a thermal fitting.

BACKGROUND

The ever growing placement of heat generating components into electronic devices means that heat dissipation from electronic devices becomes more important. U.S. Patent Application Publication No. 2012/0106083A discloses a liquid cooling system including a plurality of cooling modules, a plurality of heat exchangers, and a plurality of conduits fluidly connected to the plurality of cooling modules and the plurality of heat exchangers. The cooling module is thermally connected to a heat-generating electronic component on a circuit board of the electronic system and cools the electronic component by a coolant flowing in the cooling module.

U.S. Pat. No. 4,612,978 discloses a device for cooling a high-density integrated circuit package. The device described in U.S. Pat. No. 4,612,978 includes a board for inserting an IC package and another IC and a heat exchanger part for covering the board and sealing the IC. The coolant passing through the heat exchanger part carries away the heat associated with the operation of the IC. The heat exchanger part includes a housing having a bottom plate made of a high heat transfer material, a membrane portion including a wire mesh, and a coolant chamber having a contact plate deformable so as to be in contact with the upper surface of the IC. A plurality of heat transfer spheres are filled in the coolant chamber.

There is still a need in the relevant technology for systems and methods that facilitate the cooling of electronic components and/or devices.

SUMMARY OF THE INVENTION

In one aspect, the invention is directed to a method of manufacturing a cooling system. In one embodiment, the method includes providing a core having one or more open channels made on a first side of the core; providing a cover configured to couple to the core and to cover the channels; and thermally fitting the core and the cover to form a substantially leak proof joint between the core and the cover.

In some embodiments, the thermal fitting includes heating the cover to a first temperature to cause an expansion of the cover; placing the core at least partially in the cover; and wherein, after the cover cools to a second temperature, the core and the cover form a substantially leak proof joint. In certain embodiments, the thermal fitting involves cooling the core to a first temperature to cause a shrinking of the core; placing the core at least partially in the cover; and wherein, after the cover warms up to a second temperature, the core and the cover form a substantially leak proof joint.

In one embodiment, the method further involves providing a printed circuit board in thermal communication with a second side of the core. In some embodiments, the core is a metal core printed circuit board. In certain embodiment, the core has a fluid channel inlet and a fluid channel outlet placed on a second side of the core. In one embodiment, the cover has a peripheral raised wall, and the wall is configured to couple to a side edge of the core. In certain embodiments, the cover is made of copper.

In some embodiments, the method further includes providing a first gas accumulator and coupling the first gas accumulator to the fluid channel outlet. In certain embodiments, a second gas accumulator is coupled to the fluid channel inlet.

In one embodiment, the method further includes coupling a heat exchanger operationally to the channels. In some embodiments, the method further involve providing an electro-osmotic pump and operationally coupling the EO pump to the channels.

In certain embodiments, method includes providing a first gas accumulator operationally coupled to the channels, a pump operationally coupled to the first gas accumulator, a heat exchanger operationally coupled to the pump, and a second gas accumulator operationally coupled to the heat exchanger and to the channels.

In one embodiment, the first gas accumulator is coupled to the channels with a thermal fitting. In some embodiments, the pump is coupled to the gas accumulator with a thermal fitting. In certain embodiments, the heat exchanger is coupled to the pump with a thermal fitting. In one embodiment, the heat exchanger is coupled to the second gas accumulator with a thermal fitting. In some embodiments, the second gas accumulator is coupled to the channels with a thermal fitting.

Additional features and advantages of the embodiments disclosed herein will be set forth in the detailed description that follows, and in part will be clear to those skilled in the art from that description or recognized by practicing the embodiments described herein, including the detailed description which follows, the claims, as well as the appended drawings.

Both the foregoing general description and the following detailed description present embodiments intended to provide an overview or framework for understanding the nature and character of the embodiments disclosed herein. The accompanying drawings are included to provide further understanding and are incorporated into and constitute a part of this specification. The drawings illustrate various embodiments of the disclosure, and together with the description explain the principles and operations thereof.

BRIEF DESCRIPTION OF THE DRAWINGS

A more complete understanding of the embodiments, and the attendant advantages and features thereof, will be more readily understood by references to the following detailed description when considered in conjunction with the accompanying drawings wherein:

FIG. 16 is a perspective view of a certain component of the cooling system of FIG. 10.

FIG. 17 is a cross-sectional, perspective view of the component of FIG. 16.

FIG. 18 is a perspective view of certain components of the cooling system of FIG. 10.

DETAILED DESCRIPTION

Figure 1:
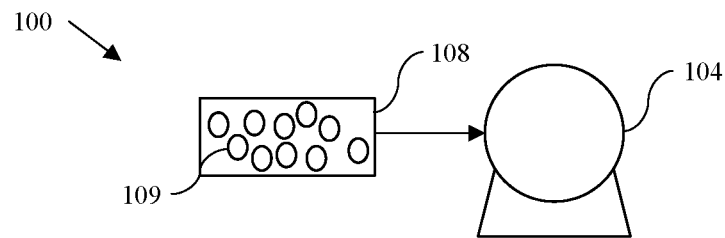
FIG. 1 is a schematic view of a pumping system according to one embodiment of the invention.

The specific details of the single embodiment or variety of embodiments described herein are set forth in this application. Any specific details of the embodiments are used for demonstration purposes only, and no unnecessary limitation or inferences are to be understood therefrom.

Before describing in detail exemplary embodiments, it is noted that the embodiments reside primarily in combinations of components related to the system. Accordingly, the device components have been represented where appropriate by conventional symbols in the drawings, showing only those specific details that are pertinent to understanding the embodiments of the present disclosure so as not to obscure the disclosure with details that will be readily apparent to those of ordinary skill in the art having the benefit of the description herein.

Referencing FIG. 1, in one embodiment, pumping system 100 can include pump 104 operationally coupled to gas accumulator 108. In some embodiments, pump 104 can be, for example, an electroosmotic (EO) pump. In certain embodiments, gas accumulator 108 can be a chamber configured to provide a space for facilitating the accumulation of gas 109, which gas 109 can be produced from, for example, electrolysis during operation of pumping system 100. Accumulation of gas 109 can facilitate mitigating the adverse effects of cavitation and/or electrode erosion.

Figure 2:
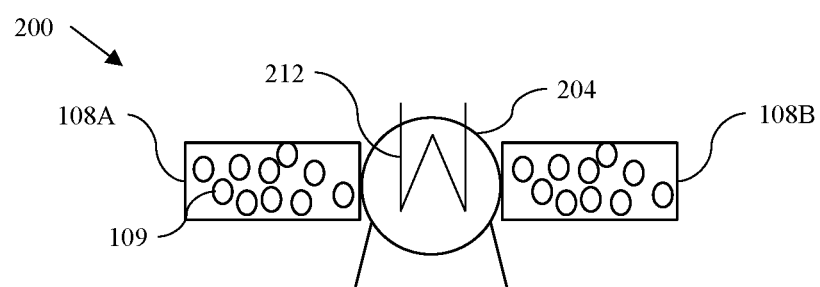
FIG. 2 is a schematic view of cooling system according to one embodiment of the invention.

Referencing FIG. 2, in one embodiment, cooling system 200 can include pump 204 integrally coupled to one or more gas accumulator chambers 108A, 108B. In some embodiments, cooling system 200 can include heat exchanger 212 integrally coupled with pump 204. Heat exchanger 212 can be, for example, a device configured to receive a hot fluid and to radiate heat from the fluid. In one embodiment, heat exchanger 212 can be, for example, a radiator with fins exposed to ambient air and/or forced cooling air. In certain embodiments, the working fluid can be, for example, water. In some embodiments, cooling system 200 can include a one-way valve (not shown), such as a tesla valve, configured to facilitate fluid flow in one direction.

In one embodiment, cooling system 200 is made leak proof by using thermal expansion to seal the joints between pump 204, gas accumulators 108A, 108B, and heat exchanger 204. The materials used to build pump 204, gas accumulators 108A, 108B, and heat exchanger 204 have suitable coefficients of thermal expansion to allow the creation of interference fits between pump 204, gas accumulators 108A, 108B, and heat exchanger 204. In one embodiment, said materials can include, for example, copper.

Figure 3:
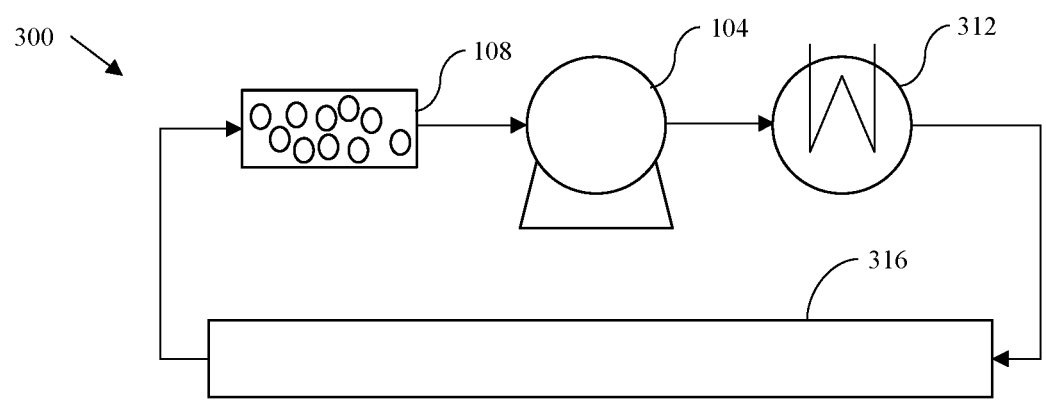
FIG. 3 is a schematic view of another cooling system according one embodiment of the invention.

Referencing FIG. 3, in one embodiment, cooling system 300 can include pump 104 operationally coupled to gas accumulator 108 and to heat exchanger 312. In one embodiment, heat exchanger 312 can be, for example, a radiator with fins for radiating heat from a hot fluid. In certain embodiments, cooling system 300 can include core 316 operationally coupled to gas accumulator 108 and/or to heat exchanger 312. In some embodiments, core 316 can be a metal plate having fluid passages or channels (not shown) for facilitating transport of a fluid in a circuit from pump 104, to heat exchanger 312, to core 316, to gas accumulator 108, and back to pump 104. In certain embodiments, the location of pump 104, gas accumulator 108, heat exchanger 312, and core 316 in the fluid flow circuit can be different. For example, in one embodiment, core 316 can be positioned between pump 104 and heat exchanger 312. In some embodiments, core 316 can be a metal plate configured to support and/or be thermally couple to a printed circuit board (not shown). In certain embodiments, cooling system 300 can be used with electronic devices having components that produce heat, which heat can be damaging to said components and, therefore, it is desired to remove the heat.

Figure 4:
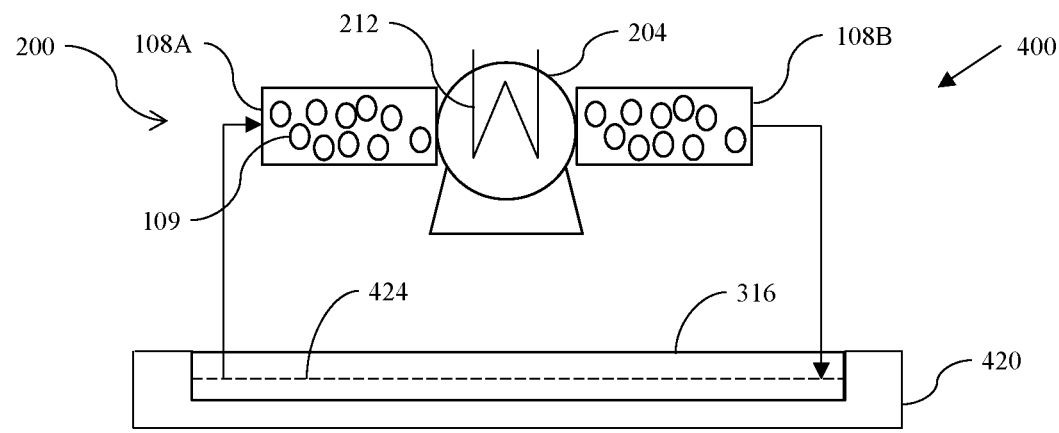
FIG. 4 is a schematic view of yet another cooling system according to one embodiment of the invention.

Referencing FIG. 4, in one embodiment, cooling system 400 can include cooling system 200 operationally coupled to cover 420. To provide a leak proof seal, in some embodiments, cover 420 is coupled to core 316 via an interference fit using materials of suitable coefficients of thermal expansion. In certain embodiments, core 316 can include channels 424 that are formed on a surface of core 316 and are covered by cover 420 when core 316 and cover 420 are assembled together. Channels 424 can be formed with, for example, CNC techniques, laser-engraving, and/or acid etching.

In one exemplary method of use of cooling system 400, a fluid is introduced into channels 424. Heat absorbed by core 316 is transferred to the fluid. The heating of core 316 can be the result of, for example, operation of electrical components thermally coupled to core 316. Operation of pump 204 causes fluid to flow from core 316 into gas accumulator 108A, wherein gas 109 can be collected—gas 109 can be produced as a result of operation of pump 204 and chemical processes (such as electrolysis) in the fluid. From gas accumulator 108A fluid flows into pump 204 and, subsequently, into or through heat exchanger 212, wherein heat from the fluid can be absorbed and dissipated by heat exchanger 212. Next, cooled fluid can flow into gas accumulator 108B, and then flow back into channels 424.

Figure 5:
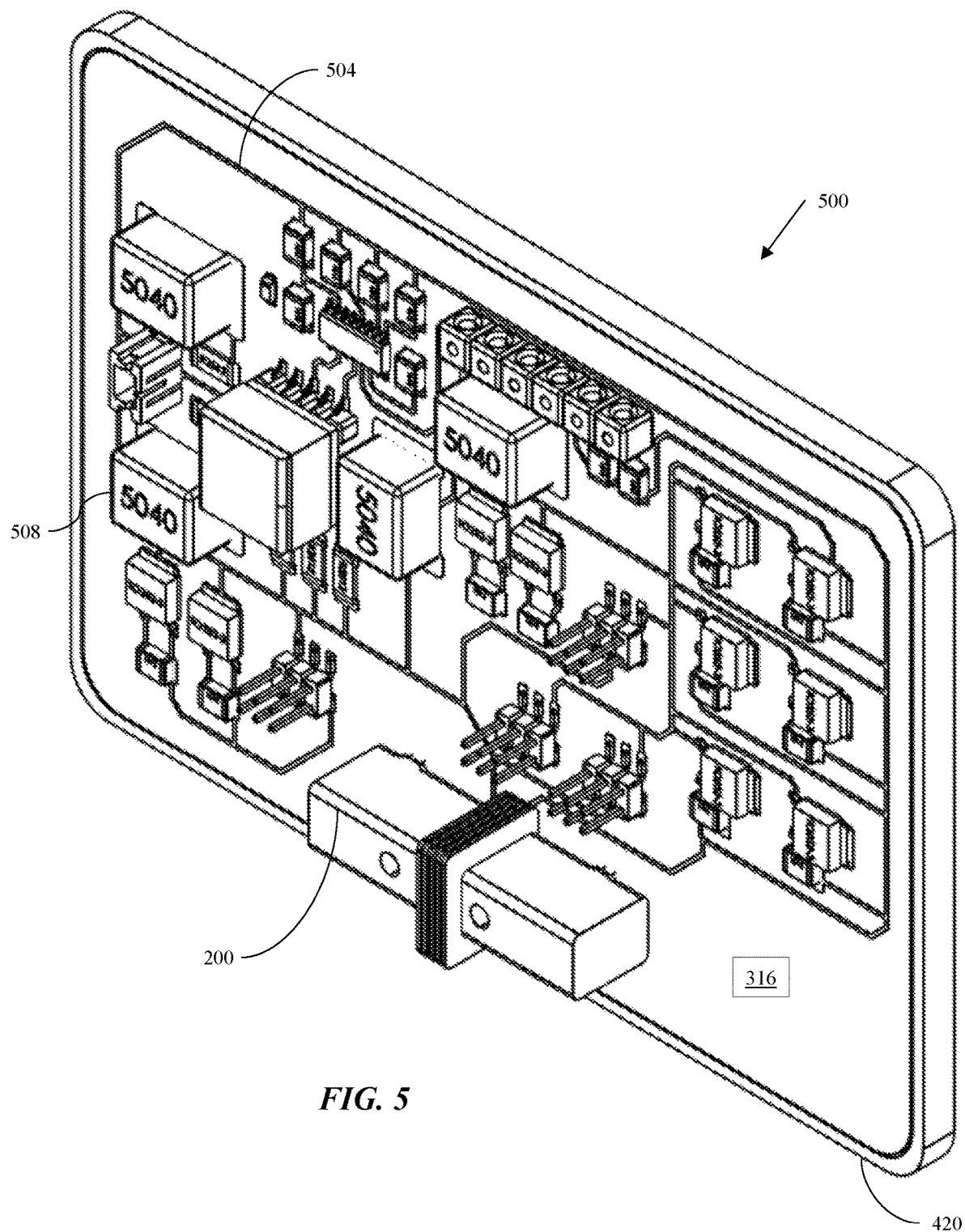
FIG. 5 is perspective view of an electronic device having a cooling system according to one embodiment of the invention.
Figure 6:
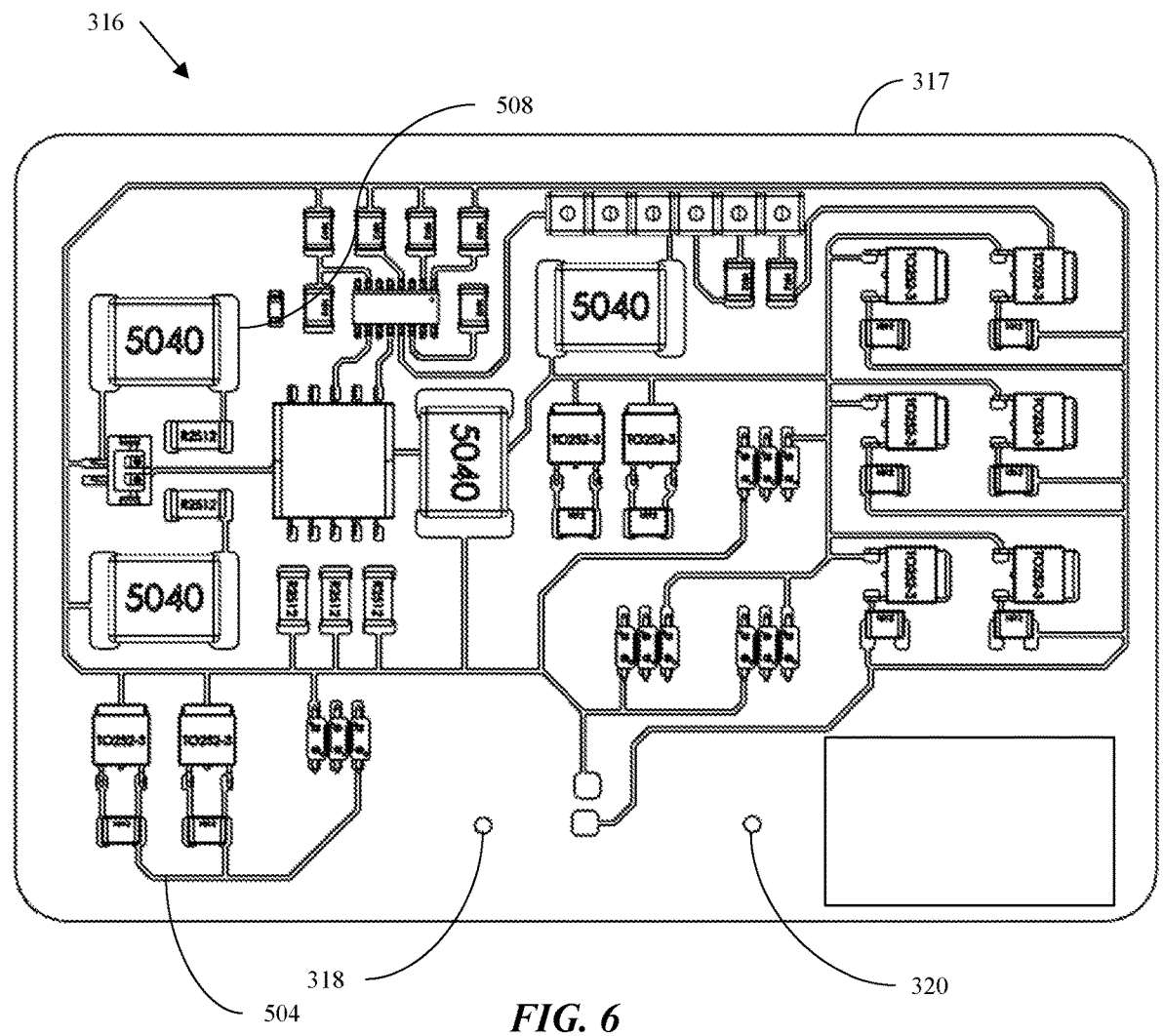
FIG. 6 is a plan top view of certain components of the electronic device of FIG. 5.

Referencing FIG. 5 and FIG. 6, in one embodiment electronic device 500 can include cooling system 200, core 316, and cover 420. Electronic device 500 can include printed circuit layer 504 and electronic components 508. Core 316 can include core fluid outlet 318 and core fluid inlet 320. Core fluid outlet 318 and core fluid inlet 320 are suitable configured to be coupled to cooling system 200 via, for example, an interference fit achieved through thermal expansion and/or thermal shrinking. Core 316 can include core periphery side 317.

Figure 7:
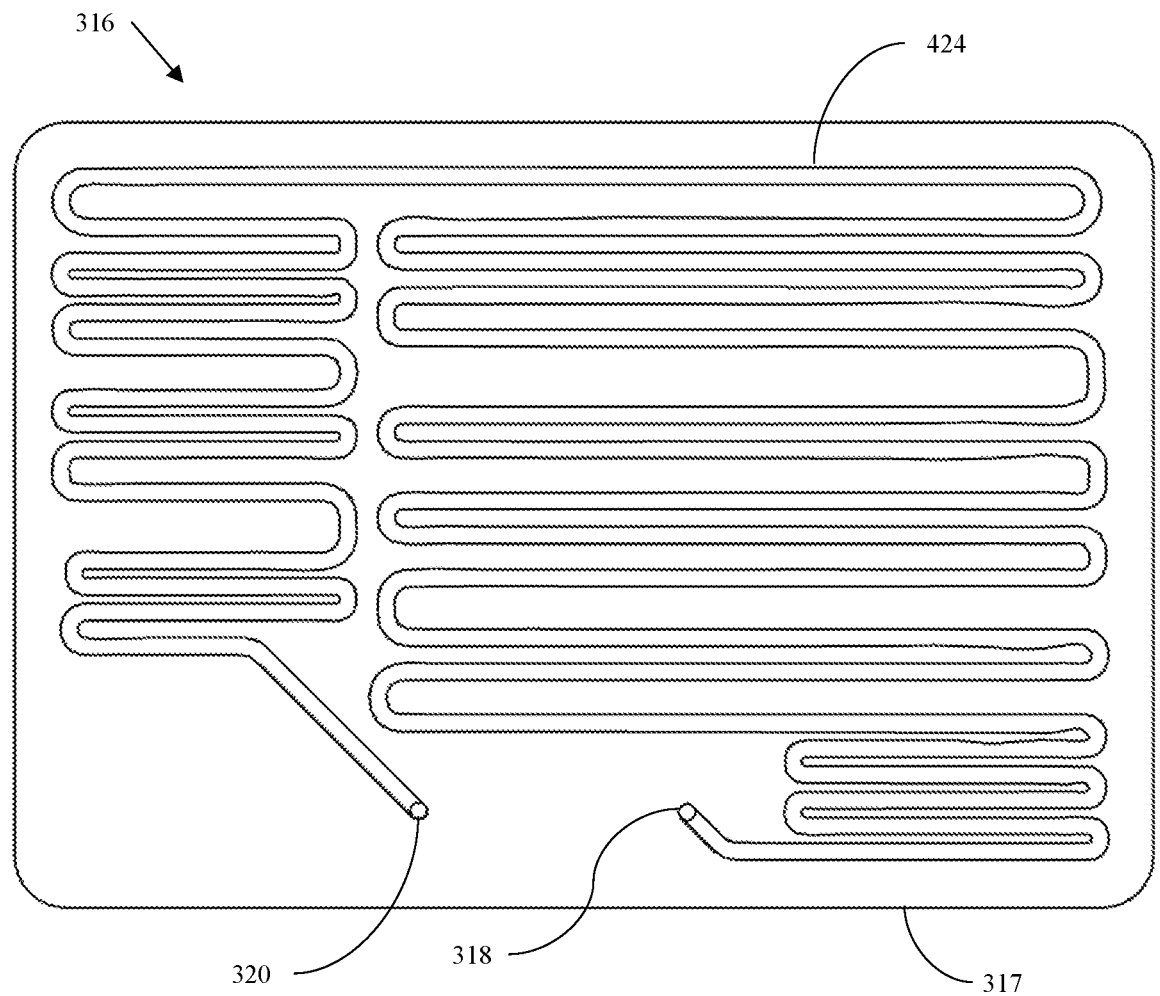
FIG. 7 is plan bottom view of certain component of the electronic device of FIG. 5.

Referencing FIG. 6 and FIG. 7, in one embodiment, core 316 can include channels 424 formed on a side of core 316. In some embodiments, channels 424 are operationally coupled to core fluid outlet 318 and to core fluid inlet 320. In certain embodiments, channels 424 are formed on a surface of core 316, then cover 420 covers channels 424 when core 316 and cover 420 are assembled together. In other embodiments, core 316 can include channels (not shown) integrated within core 316 to facilitate the transport of fluid from cooling system 200, to core fluid inlet 320, through the channels of core 316, to core fluid outlet 318, and back to cooling system 200. In some embodiments where core 316 includes integrated channels, electronic device 500 may not use cover 420.

In certain embodiments, the location, shape and/or size of channels 424 can be configured to account for the specific heat production of electronic components 508 mounted on core 316. For example, areas of core 316 having fewer electronic components 508 would have corresponding areas of channels 424 of lower density of channels 424 and/or smaller channels 424. Typically, there is a high amount of heat generated at the P-N Junction (not shown) where each electronic component 508 is soldered to a MC-PCBA (metal core printed circuit board assembly) surface. In some embodiments, channel 424 can be placed directly beneath the P and N Junctions, preferably about 0.5 mm from the heat generating P and N Junctions.

Figure 8:
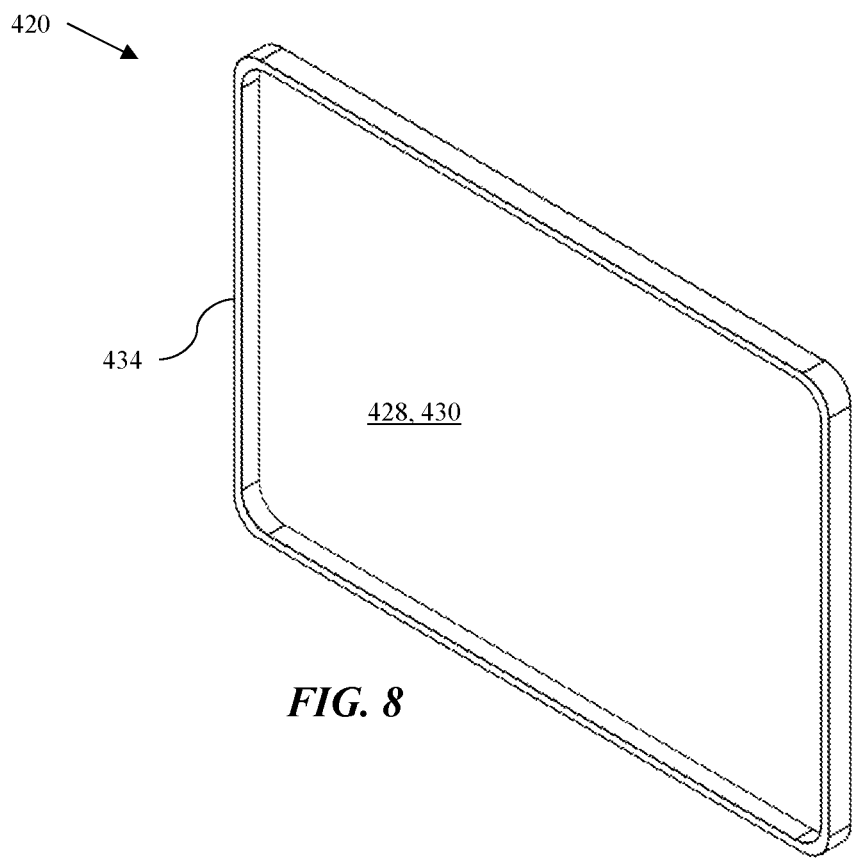
FIG. 8 is a perspective view of certain component of the electronic device of FIG. 5.
Figure 9:
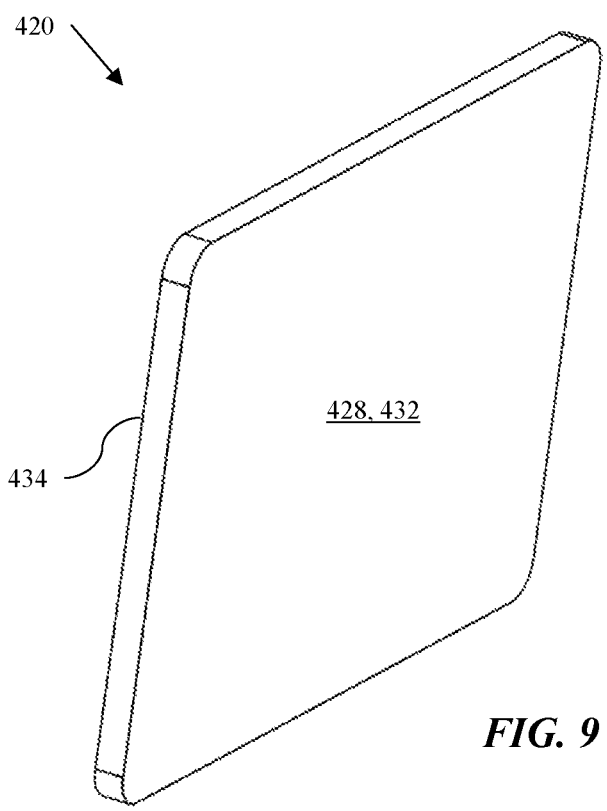
FIG. 9 is another perspective view of the component of FIG. 8.

Referencing FIG. 8 and FIG. 9, in one embodiment, cover 420 can include cover plate 428, which cover plate 428 can include cover plate inner side 430 and cover plate outer side 432. In some embodiments, cover plate 428 can include cover wall 434, which cover wall 434 can be a peripheral wall that is raised all around the perimeter of cover plate 428.

Referencing FIG. 7 through FIG. 9, in one embodiment, the materials of core 316 and cover wall 434 are selected to facilitate creating a leak proof seal between core 316 and cover wall 434. In one embodiment, cover wall 434 has a thermal coefficient that allows an expansion of cover wall 434 at a first temperature. Then core 316 can be placed into cover 420. Next, as cover 420 cools to a second temperature, cover wall 434 shrinks onto core periphery side 317—thereby creating a leak proof interference fit between cover wall 434 and core periphery side 317. In certain embodiments, core 316 can be made of a material having a thermal coefficient such that core 316 shrinks when core 316 is cooled to a third temperature. Then core 316 can be placed inside cover 420. As core 316 returns to a fourth temperature, core 316 expands to create an interference fit between core periphery side 317 and cover wall 434—thereby creating a leak proof seal between core periphery side 317 and cover wall 434.

Figure 10:
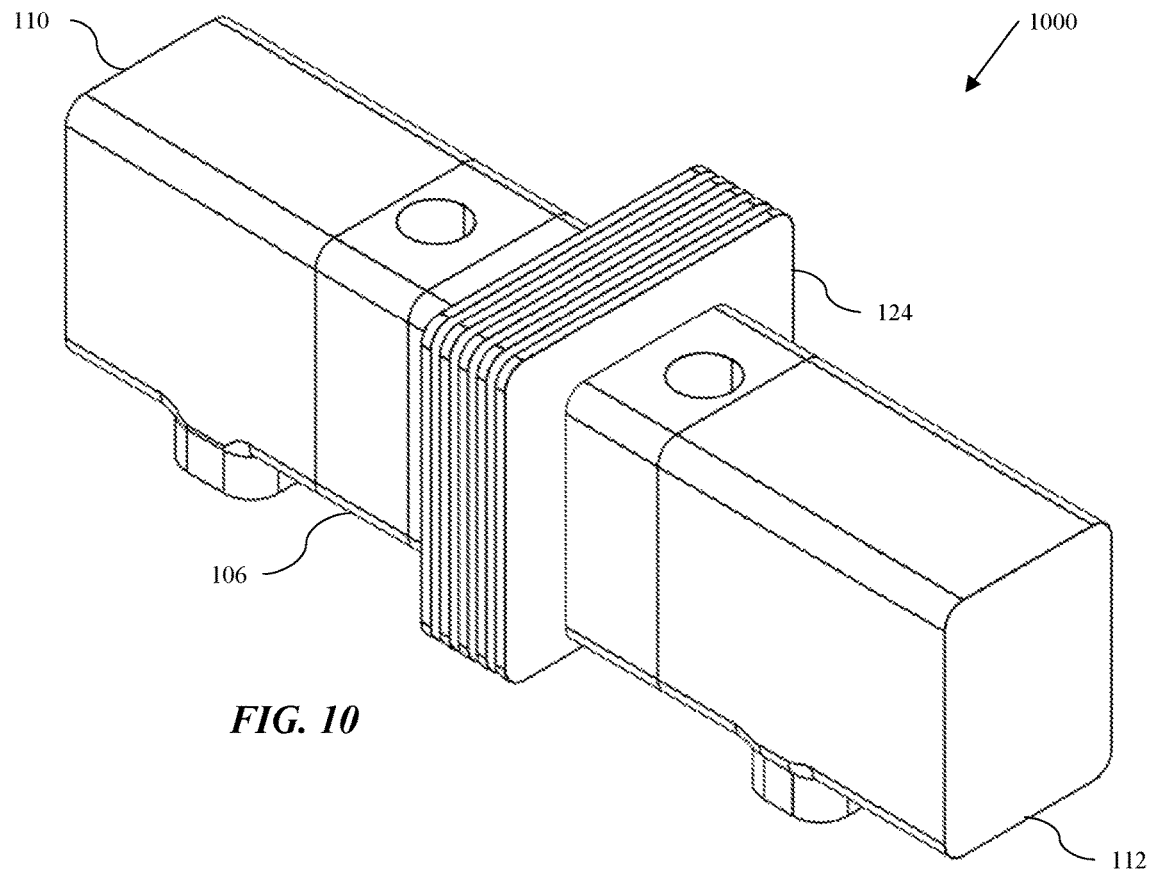
FIG. 10 is a perspective view of a cooling system according to another embodiment of the invention.
Figure 11:
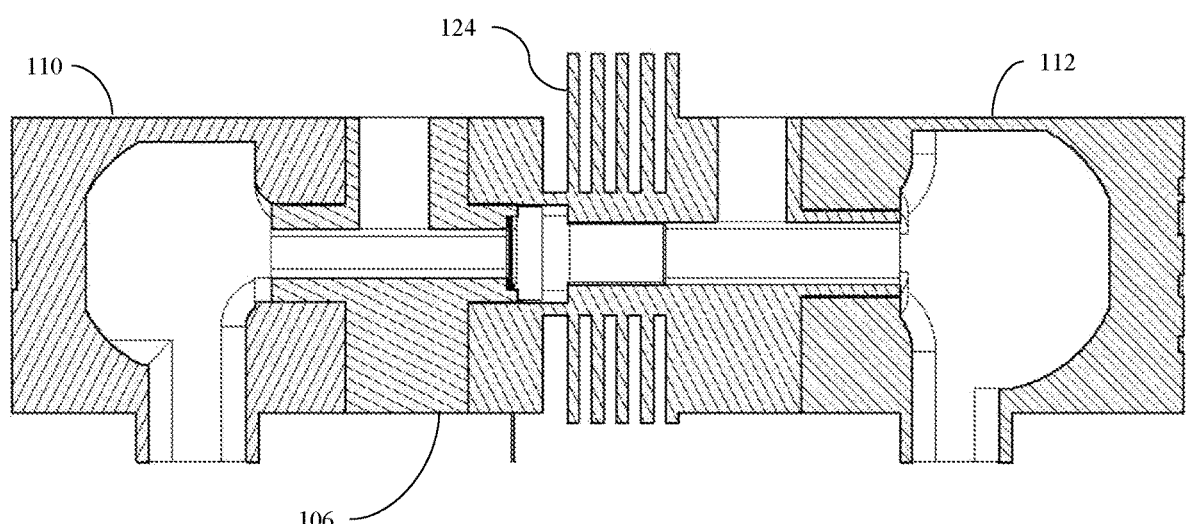
FIG. 11 is a cross-sectional view of the cooling system of FIG. 10.

Referencing FIG. 10 and FIG. 11, in one embodiment cooling system 1000 can include inlet gas accumulator 110 coupled to electro-osmosis (EO) pump 106. In some embodiments, cooling system 1000 can include heat exchanger 124 coupled to EO pump 106. In certain embodiments, cooling system 1000 can include outlet gas accumulator 112 coupled to heat exchanger 124.

In certain embodiments, inlet gas accumulator 110, EO pump 106, heat exchanger 124, and outlet gas accumulator 112 are configured to facilitate the creation of leak proof seals between the corresponding coupling components. In one embodiment, for example, inlet gas accumulator 110 can be configured to be coupled to EO pump 106 via an interference fit, and the interference fit can be produced through, for example, thermal expansion of inlet gas accumulator 110 and placing a portion of EO pump 106 in inlet gas accumulator 110. Similarly, heat exchanger 124 can be made of a suitable material having a thermal coefficient to facilitate the expansion of heat exchanger 124 and placement of a portion of EO pump 106 in heat exchanger 124.

Figure 12:
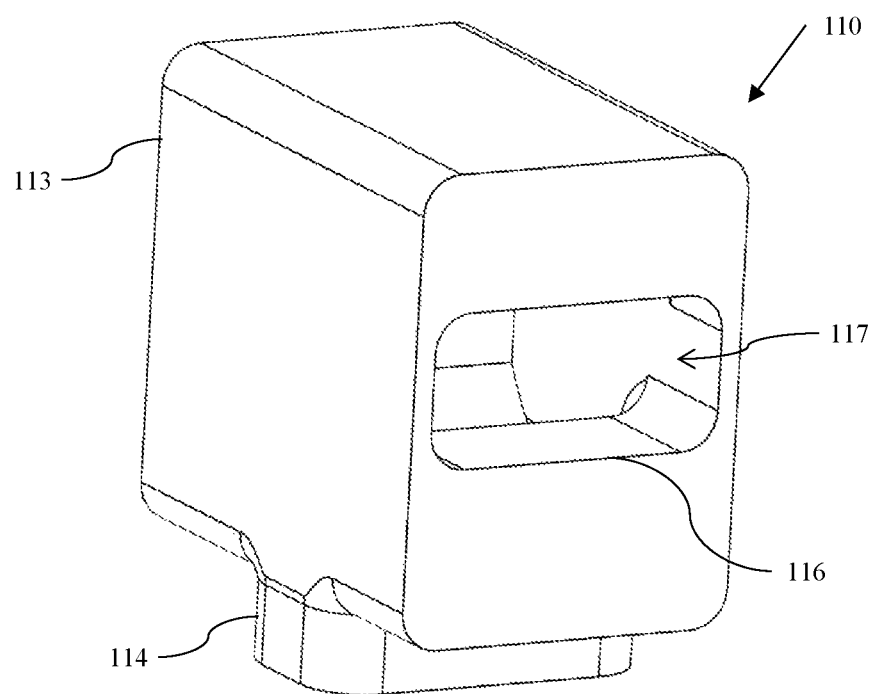
FIG. 12 is a perspective view of a certain component of the cooling system of FIG. 10.
Figure 13:
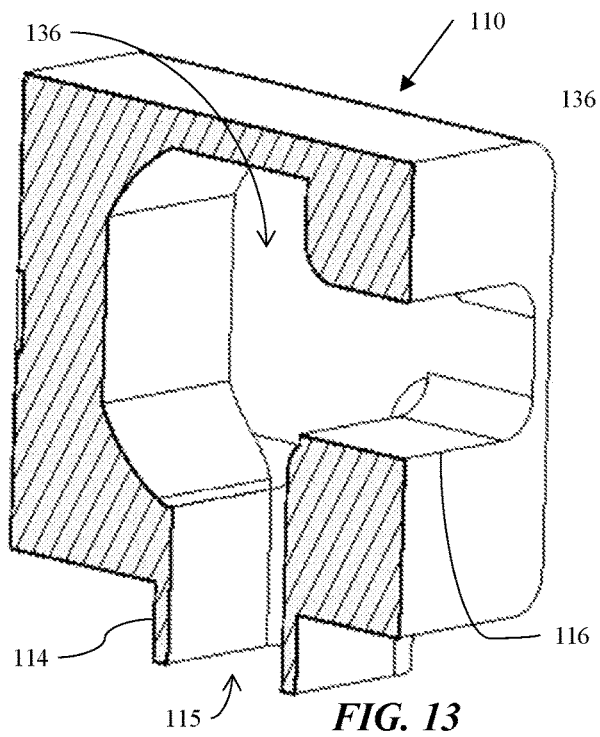
FIG. 13 is a cross-sectional, perspective view of the component of FIG. 12.
Figure 14:
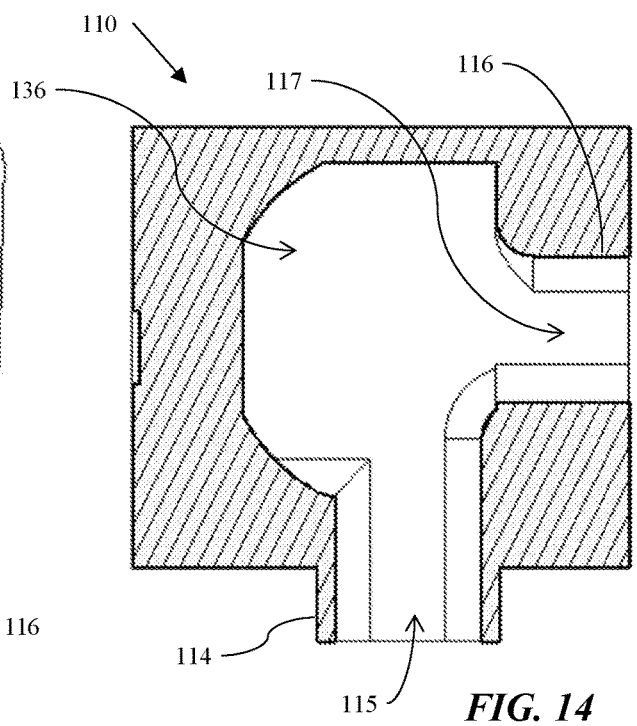
FIG. 14 is a cross-sectional, plan view of the component of FIG. 12.

Referencing FIG. 12 through FIG. 14, in one embodiment inlet gas accumulator 110 can include gas accumulator body 113. In some embodiments, gas accumulator body 113 can include gas accumulator inlet 114, which gas accumulator inlet 114 can be a protruding portion of gas accumulator body 113, and which gas accumulator inlet 114 can define inlet pathway 115 for facilitating a fluid flow into inlet gas accumulator 110. In one embodiment, gas accumulator body 113 can include pump receptacle 116 configured to couple to a portion of, for example, EO pump 106. Pump receptacle 116 can be configured to define outlet pathway 117 for facilitating a fluid flow out of inlet gas accumulator 110. In certain embodiments, gas accumulator body 113 can include gas collection chamber 136 configured to provide a space for facilitating collection of a gas that can be produced during operation of, for example, cooling system 1000. In one embodiment, gas accumulator inlet 114 can be configured to couple to core fluid outlet 318 (FIG. 6) via, for example, an interference fit to provide a leak proof seal.

Figure 15:
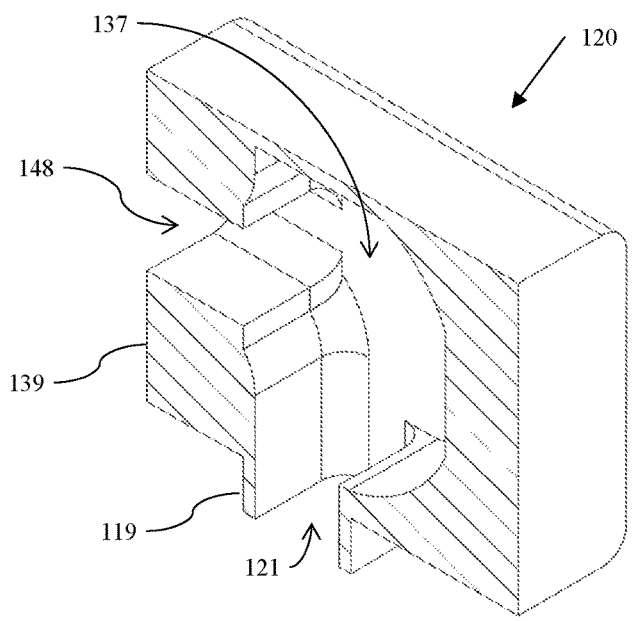
FIG. 15 is a cross-sectional, perspective view of a certain component of the cooling system of FIG. 10.
Figure 19:
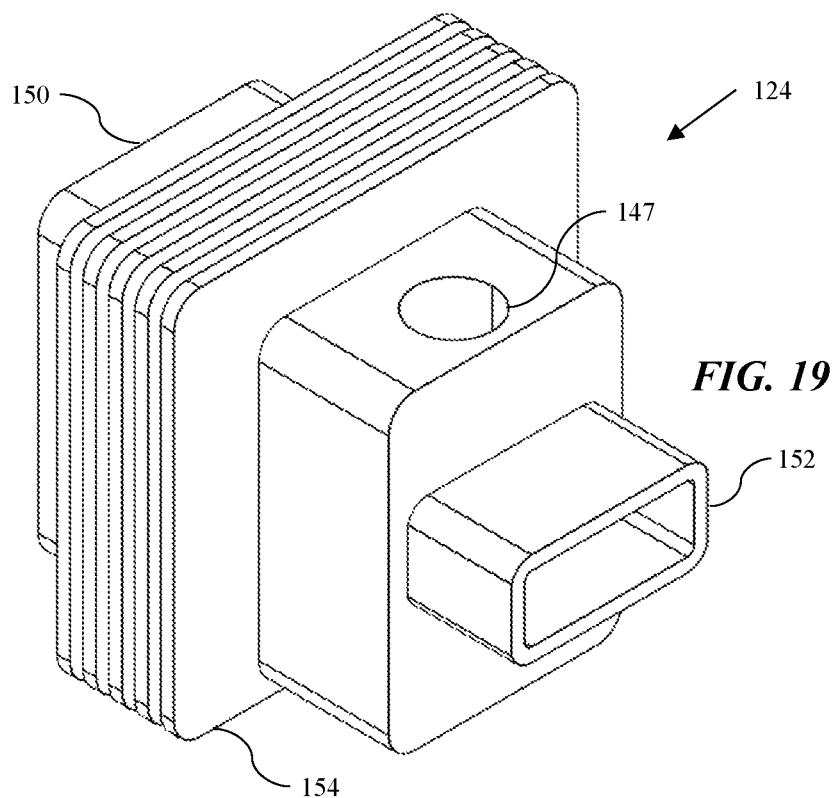
FIG. 19 is a perspective view of a certain component of the cooling system of FIG. 10.
Figure 20:
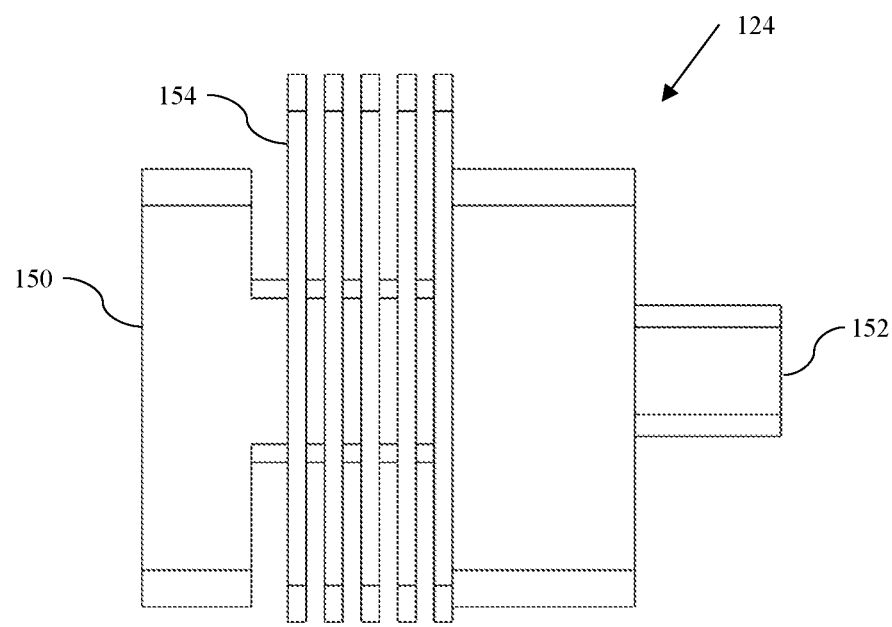
FIG. 20 is a plan, bottom view of the component of FIG. 19.
Figure 21:
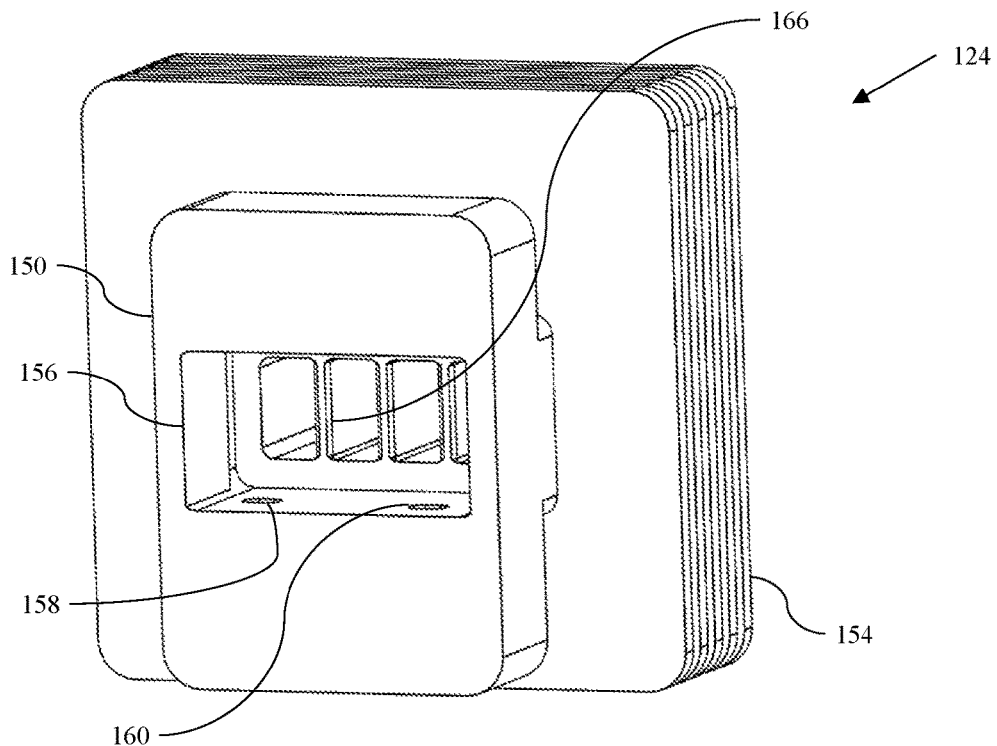
FIG. 21 is a perspective view of the component of FIG. 19.
Figure 22:
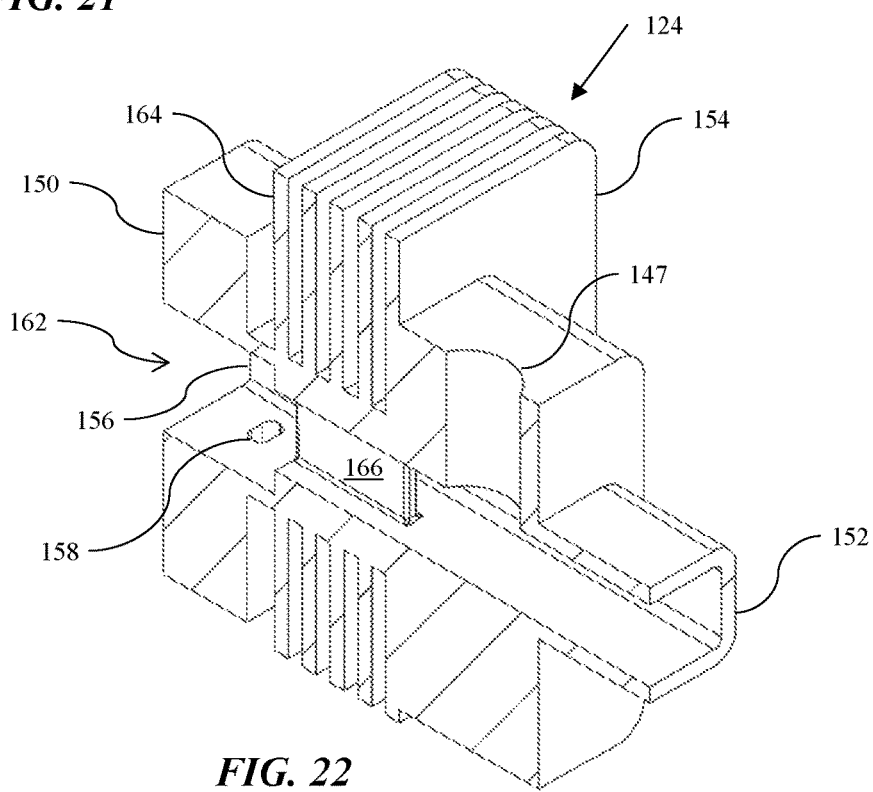
FIG. 22 is a cross-sectional, perspective view of the component of FIG. 19.

Referencing FIG. 15, in one embodiment, outlet gas accumulator 120 can be configured substantially the same as inlet gas accumulator 110. In some embodiments, outlet gas accumulator 120 can include gas collection chamber 137. In one embodiment, outlet gas accumulator 120 can include heat exchanger receptacle 139 configured to couple to a portion of, for example, heat exchanger 124. Heat exchanger receptacle 139 can be configured to define inlet pathway 148 for facilitating a fluid flow into outlet gas accumulator 120. In certain embodiments, outlet gas accumulator 120 can include gas accumulator outlet 119, which gas accumulator outlet 119 can be a protruding portion of outlet gas accumulator 120, and which gas accumulator outlet 119 can define outlet pathway 121 for facilitating a fluid flow out of outlet gas accumulator 120. In one embodiment, gas accumulator outlet 119 can be configured to couple to core fluid inlet 320 (FIG. 6) via, for example, an interference fit to provide a leak proof seal.

Referencing FIG. 16 through FIG. 18, in one embodiment EO pump 106 can include gas accumulator coupler 138 configured to couple to pump receptacle 116. In some embodiments, gas accumulator coupler 138 can be a protruding portion of EO pump 106 that can be fit into pump receptacle 116 to create a leak proof seal, which leak proof seal can be made by, for example, creating an interference fit between gas accumulator coupler 138 and pump receptacle 116. The interference fit can be produced through, for example, the use of thermal shrinking and/or expansion of either or both of gas accumulator coupler 138 and pump receptacle 116.

In certain embodiments, EO pump 106 can include membrane holder 122 configured to receive and retain membrane 134. In some embodiments, membrane holder 122 can include membrane seat 123 configured to receive and support membrane 134. In one embodiments, membrane 134 can be made of alumina, for example. Membrane seat 123 can be defined, for example, by a recessed surface of membrane holder 122. In one embodiment, membrane holder 122 can be configured to couple to heat exchanger 124 to produce a leak proof seal, using thermal expansion and/or shrinking for example. In some embodiments, EO pump 106 can include pump fluid passageway 140 configured to facilitate a flow of fluid through EO pump 106. In one embodiment, EO pump 106 can include pump filling port 146 configured to facilitate the filling of cooling system 1000 with a fluid.

In certain embodiments, membrane holder 122 can include electrode accommodators 142, 144 configured to facilitate the location and placement of electrodes 126, 128. In one embodiment, EO pump 106 can include electrode rubber inserts 130, 132 configured to cover at least a portion of electrodes 126, 128.

Referencing FIG. 19 through FIG. 22, in one embodiment heat exchanger 124 can include heat exchanger pump coupler 150 and outlet gas accumulator coupler 152. In some embodiments, heat exchanger 124 can include radiator 154 interposed between heat exchanger pump coupler 150 and outlet gas accumulator coupler 152. In one embodiment, radiator 124 can include pump filling port 147 configured to facilitate the filling of cooling system 1000 with a fluid.

In some embodiments, heat exchanger pump coupler 150 can include pump receptacle 156 configured to receive and retain membrane holder 122. In certain embodiments, pump receptacle 156 is configured to provide a leak proof seal with membrane holder 122 via, for example, an interference fit produced by thermal expansion of pump receptacle 156 and placing membrane holder 122 into pump receptacle 156. In one embodiment, pump coupler 150 can include electrode passageways 158, 160 to facilitate insertion of electrodes 126, 128 into pump receptacle 156. In some embodiments, pump receptacle 156 can include fluid passageway 162 for facilitate a fluid flow from EO pump 106 into heat exchanger 124.

In some embodiments, radiator 154 can include one or more fins 164 to facilitate the radiating of heat from heat exchanger 124. In one embodiment, radiator 154 can include a plurality of radiator channels 166 configured to split a fluid flow through radiator 154 to facilitate exposing the fluid to a greater surface area of radiator 154, to thereby increase the removal of heat from the fluid by radiator 154.

In one embodiment, outlet gas accumulator coupler 152 can be configured to couple to heat exchanger receptacle 139 (FIG. 15). In some embodiments, a leak proof seal between outlet gas accumulator coupler 152 and heat exchanger receptacle 139 can be provided by thermal expansion of heat exchanger receptacle 139 and placement of outlet gas accumulator coupler 152 into heat exchanger receptacle 139.

Referencing FIG. 5 through FIG. 22, an example of using cooling electronic device 500 is now described. A fluid is introduced into channels 424 via, for example, pump filing port 146 or pump filing port 147. Electricity is applied to electrodes 126, 128, thereby causing an electroosmotic flow of the fluid through EO pump 106. During operation of electronic device 500, electronic components 508 generate heat, which heat is absorbed by the fluid in channels 424. The fluid exits core 315 via core fluid outlet 318 and enters inlet gas accumulator 110 via inlet pathway 115. Gas that can be produced from reactions in the fluid due to electro-osmosis are accumulated in gas collection chamber 136. The fluid next moves into EO pump 106 via outlet pathway 117 and into pump fluid passageway 140.

Under the electro-osmotic effect, the fluid crosses membrane 134 into fluid passageway 162 of heat exchanger 124. The fluid then flows into radiator channels 166, and heat from the fluid is dissipated into radiator channels 166 and fins 164. Cooler fluid then flows into inlet pathway 148 of outlet accumulator 120. Gas from the electro-osmosis process can be accumulated in gas collection chamber 137. The cooled fluid then flows from outlet accumulator 120 into core 315 via gas accumulator outlet 119 and core fluid inlet 320.

Figure 23:
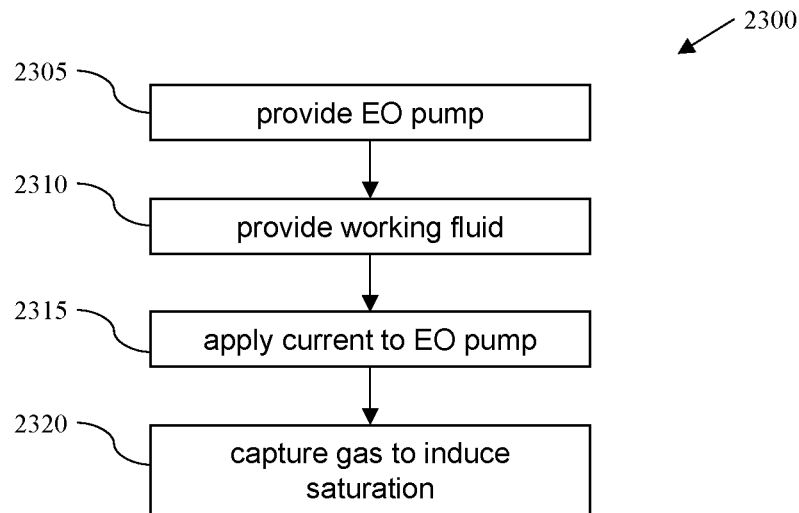
FIG. 23 is a flowchart of a method of cooling according to one embodiment of the invention.

Referencing FIG. 23, in one embodiment, method 2300 of cooling electronic components includes providing an EO pump 2305, providing a working fluid 2310, applying electrical current to the EO pump 2315, and capturing substantially all the gas 2320 produced by operation of the pump to ensure the gas stays within an enclosure operationally coupled to the EO pump and the working fluid—thereby facilitating or inducing saturation. In some embodiments, the working fluid can be distilled water. In one embodiment, the current applied is DC current. In certain embodiments, the gas can be captured by providing hermetically sealed pathways for the working fluid and the gas. Any joints, between components of a cooling system configured to use method 2300, can be sealed (and substantially made leak proof) by, for example, using thermal fitting between components. Capturing the gas facilitates, among other things, achieving a chemical equilibrium that reduces and/or (substantially) eliminates the chemical reaction that produces the gas. In some embodiments, reducing said chemical reaction can facilitate, for example, reducing cavitation and/or electrode erosion. In certain embodiments, gas collection chambers can be provided to facilitate collecting the gas in a space so that substantially there are no gas bubbles traveling through the cooling pathways of the working fluid. As gas molecules are produced by the chemical reactions involved in operating the EO pump, the gas molecules travel through the working fluid channels and into the gas collection chambers. In some embodiments, the gas collection chambers are configured to allow continuous interaction between the gas molecules and the working fluid—so that a saturation of the gas is achieved.

Figure 24:
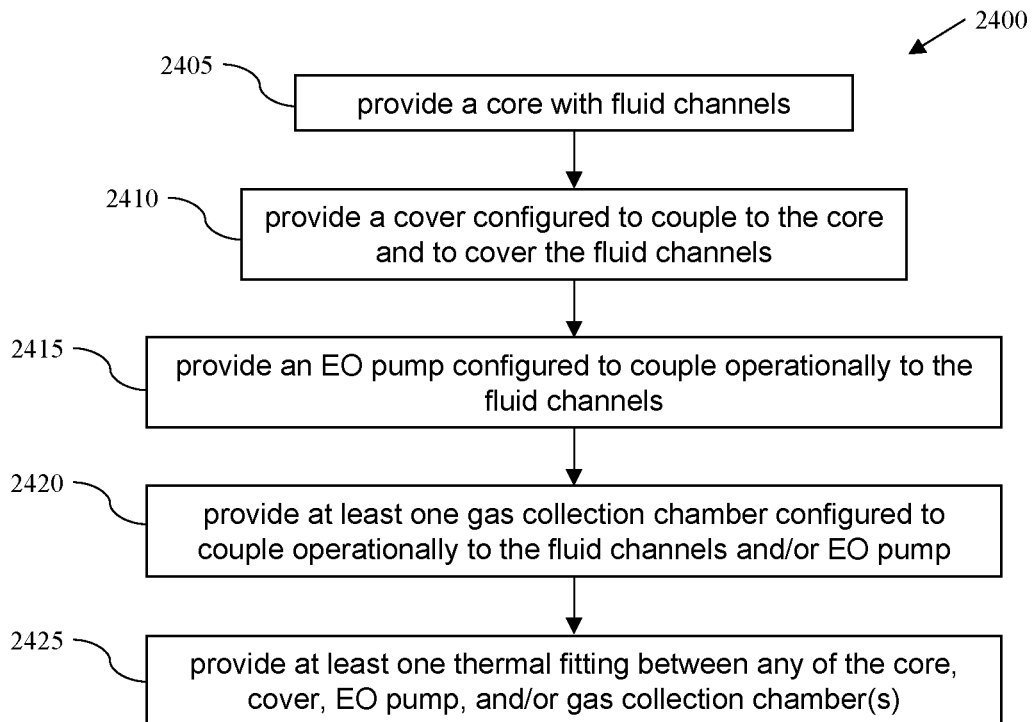
FIG. 24 is a flowchart of a method of manufacturing a cooling system according to one embodiment of the invention.

Referencing FIG. 24, in one embodiment, method 2400 of manufacturing a cooling system can include providing a core with fluid channels 2405, providing a cover configured to couple to the core and to cover the fluid channels 2410, providing an EO pump configured to couple operationally to the fluid channels 2415, providing at least one gas collection chamber configured to be operationally coupled to the fluid channels and/or EO pump 2420, and providing at least one thermal fitting between any of the core, cover, pump, and/or at least one gas collection chamber 2425. In some embodiments, method 2400 can further include providing a heat exchanger configured to operationally couple to the EO pump and/or the fluid channels. In one embodiment, the core can be a PCB core. In some embodiments, the EO pump can be configured to operate with DC current. In certain embodiments, the thermal fitting involves heating or cooling one component (for example, the cover) to produce a corresponding expansion or a shrinking of the component, then placing a second component (for example, the core) in an interference fit with the first component to ensure a leak proof seal.

In some embodiments, manufacturing cooling system 200, cooling system 300, and/or cooling system 400, for example, can involve manufacturing cooling systems that are leak proof through integration of components by using, for example, 3d printing techniques. Referencing FIG. 4, in one embodiment, gas accumulator chambers 108A, 108B, pump 204, and/or heat exchanger 212 can be made leak proof by manufacturing these components as a single, integrated piece with 3$d$ printing. Similarly, referencing FIG. 10 and FIG. 11, in some embodiments, inlet gas accumulator 110 and pump 106 can be made as a single, integrated piece; and outlet gas accumulator 112 and heat exchanger 124 can be made as a single, integrated piece.

Figure 25:
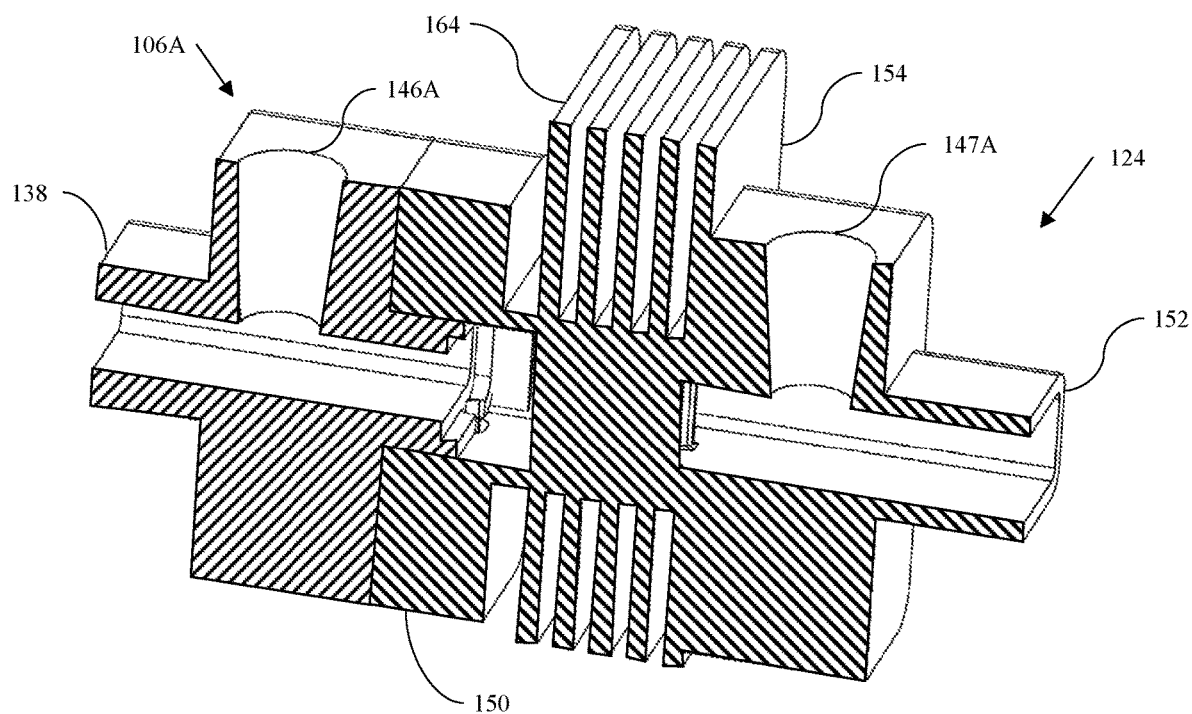
FIG. 25 is a cross-sectional, perspective view of certain components of a cooling system according to one embodiment of the invention.

Referencing FIG. 25, in one embodiment, pump 106A can be provided with pump filing port 146A having a conical shape, with the wider part of the cone being proximal to the external side of pump filing port 146A. The conical shape is configured to facilitate, among other things, (i) a filling of fluid into system cooling system 1000 a syringe while allowing air to escape, and (ii) a thermal fitting of port cap 2600 into pump filling port 146A. Similarly, heat exchanger 124A can be provided with pump filing port 147A having a conical shape, with the wider part of the cone being proximal to the external side of pump filing port 147A.

Figure 26:
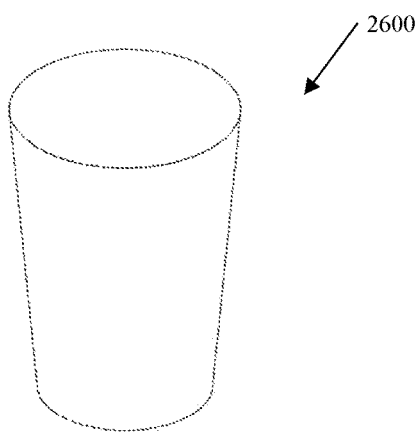
FIG. 26 is a perspective view of a certain component that can be used with the components of FIG. 25.

Referencing FIG. 26, in one embodiment filling port cap 2600 can have a generally conical shape configured to provide a leak proof seal when fitted into pump filling port 146A, 147A. In some embodiments, cap 2600 can be cooled to cause a shrinking of cap 2600, then cap 2600 can be placed into pump filling port 146A, 147A. In certain embodiments, pump 106A and/or heat exchanger 124A can be heated to cause an expansion of pump 106A and/or heat exchanger 124A, then cap 2600 can be placed into pump filling port 146A, 147A to form a leak proof seal.

In some embodiments, insertion of metallic components to a metal core printed circuit board can be achieved as follows. E-Young's Modulus; ε-Material Strain; L-Length of material; δ-Change in length; θ-Material Stress; F-Applied Force; A-Area of pressure; N-Normal Force; Ff-Frictional force; μs-Static coefficient of friction.

In thermal expansion a mass of material decreases in density through the increase of its volume. In certain materials thermal expansion occurs drastically during a phase change from solid to liquid.

The expansion of a material subjected to a thermal load is directly proportional to the temperature increase and a material based intrinsic expansion coefficient. The reverse function also holds true when a material is cooled.

To create a tight enough fit reference to stress of materials equations can be used. $\sigma/\varepsilon = E$ (1); $\varepsilon = \delta l / L1$ (2); $\sigma = F/A$ (3). The Young's modulus of a material is a constant and, therefore, a given force F over a fixed area A produces a quantifiable deformation $\delta l$.

Given a rod heated to a certain temperature, the rod's length increases from L1 to L2. If the rod is positioned between a column 1 and a column 2, it is unable to expand. Since the rod would normally expand to a length L2, it is possible to determine the force that the columns exert on the rod to hold it in place, using equation (2), followed by equation (1), and lastly equation (3) to solve for the applied force F.

Friction is a contact force that opposes motion. In the case of thermal fittings, friction prevents components from being released. The frictional force is directly proportional to the contact force F and the respective frictional coefficients of the materials. $F=Ff*\|s$ (4). The frictional force should be maximized whilst ensuring that the applied force F does not produce plastic deformation of the components.

In one example, the following illustrates the deformation of components when subjected to a temperature change. Once the thermal load produces the expansion or contraction of a component, the component can be assembled and will match the size of a respective boss or cavity upon reaching thermal equilibrium.

A copper boss having a boss width of 1.5 mm was exposed to a temperature of 210K for 1 second. The boss width shrank by approximately 0.02 mm. Therefore, the copper boss can be fit into a cavity having a 1.5 mm width, which then results in a leak proof, thermal interference fit when the copper boss returns to ambient temperature. A copper cover having a cover width of 287 mm was exposed to 373K for 1 second. The cover width expanded by approximately 0.32 mm. Therefore, a core (for example) having a core width of 287 mm can be placed inside the cover, which then results in a leak proof, thermal interference fit when the cover returns to ambient temperature.

Many different embodiments have been disclosed herein, in connection with the above description and the drawings. It will be understood that it would be unduly repetitious and obfuscating to literally describe and illustrate every combination and subcombination of these embodiments. Accordingly, all embodiments can be combined in any way and/or combination, and the present specification, including the drawings, shall be construed to constitute a complete written description of all combinations and subcombinations of the embodiments described herein, and of the manner and process of making and using them, and shall support claims to any such combination or subcombination.

It will be appreciated by persons skilled in the art that the present embodiment is not limited to what has been particularly shown and described hereinabove. A variety of modifications and variations are possible in light of the above teachings without departing from the following claims.

The invention claimed is:

1. A method of manufacturing a cooling system, the method comprising:
   providing a core having one or more open channels made on a first side of the core;
   providing a printed circuit board in thermal communication with a second side of the core:
   providing a cover configured to couple to the core and to cover the channels;
   thermally fitting the core and the cover;
   wherein thermally fitting comprises:
   heating the cover to a first temperature to cause an expansion of the cover;
   placing the core at least partially in the cover; and
   wherein, after the cover cools to a second temperature, the core and the cover form a sealed joint between the core and the cover.

2. The method of claim 1, wherein providing a core further comprises providing a core having a fluid channel inlet and a fluid channel outlet, both the fluid channel inlet and the fluid channel outlet placed on a second side of the core.

3. The method of claim 2, further comprising providing a first gas accumulator operationally coupled to the channels.

4. The method of claim 3, further comprising providing a heat exchanger and an electro-osmotic pump, both the heat exchanger and the electro-osmotic pump operationally coupled to the channels.

5. The method of claim 1, wherein providing a core comprises providing a metal core printed circuit board.

6. The method of claim 1, wherein providing a cover comprises providing a cover made of copper.

7. The method of claim 1, wherein providing a core further comprises providing a core having fluid channel inlet and a fluid channel outlet placed on a second side of the core, and further comprising providing a first gas accumulator and coupling the first gas accumulator to the fluid channel inlet.

8. The method of claim 1, further comprising providing a first gas accumulator operationally coupled to the channels.

9. The method of claim 1, further comprising providing a heat exchanger operationally coupled to the channels.

10. The method of claim 1, further comprising providing an electro-osmotic pump operationally coupled to the channels.

11. A method of manufacturing a cooling system, the method comprising:
   providing a core having one or more open channels made on a first side of the core;
   providing a printed circuit board in thermal communication with a second side of the core;
   providing a cover configured to couple to the core and to cover the channels;
   thermally fitting the core and the cover to form a sealed joint between the core and the cover; and
   providing a first gas accumulator operationally coupled to the channels, a pump operationally coupled to the first gas accumulator, a heat exchanger operationally coupled to the pump, and a second gas accumulator operationally coupled to the heat exchanger and to the channels.

12. The method of claim 11, further comprising coupling the first gas accumulator to the channels with a thermal fitting.

13. The method of claim 11, further comprising coupling the pump to the gas accumulator with a thermal fitting.

14. The method of claim 11, further comprising coupling the heat exchanger to the pump with a thermal fitting.

15. The method of claim 11, further comprising coupling the heat exchanger to the second gas accumulator with a thermal fitting.

16. The method of claim 11, further comprising the second gas accumulator to the channels with a thermal fitting.

17. A method of manufacturing a cooling system, the method comprising:
   providing a core having one or more open channels made on a first side of the core;
   providing a cover configured to couple to the core and to cover the channels;
   thermally fitting the core and the cover;
   wherein thermally fitting comprises:
      cooling the core to a first temperature to cause a shrinking of the core;
      placing the core at least partially in the cover; and
      wherein, after the cover warms up to a second temperature, the core and the cover form a sealed joint between the core and the cover.

18. A method of manufacturing a cooling system, the method comprising:
   providing a core having one or more open channels made on a first side of the core;
   providing a cover configured to couple to the core and to cover the channels;
   thermally fitting the core and the cover to form a sealed joint between the core and the cover; and
   wherein providing a cover comprises providing a cover having a peripheral raised wall, said wall configured to couple to a side edge of the core.

19. A method of manufacturing a cooling system, the method comprising:
   providing a core having one or more open channels made on a first side of the core;
   providing a printed circuit board in thermal communication with a second side of the core;
   providing a cover configured to couple to the core and to cover the channels;
   thermally fitting the core and the cover to form a sealed joint between the core and the cover;
   wherein providing a core further comprises providing a core having a fluid channel inlet and a fluid channel outlet placed on a second side of the core;
   providing a first gas accumulator and coupling the first gas accumulator to the fluid channel outlet; and
   providing a second gas accumulator and coupling the second gas accumulator to the fluid channel inlet.

* * * * *